United States Patent [19]

Fujiwara

[11] Patent Number: 4,782,035

[45] Date of Patent: Nov. 1, 1988

[54] METHOD OF FORMING A WAVEGUIDE FOR A DFB LASER USING PHOTO-ASSISTED EPITAXY

[75] Inventor: Masatoshi Fujiwara, Itami, Japan

[73] Assignee: Mitsubishi Denki Kabushiki Kaisha, Japan

[21] Appl. No.: 119,724

[22] Filed: Nov. 12, 1987

[30] Foreign Application Priority Data

Sep. 8, 1987 [JP] Japan ................ 62-224477

[51] Int. Cl.$^4$ ............... H01S 3/19; H01L 21/208
[52] U.S. Cl. ............. 437/129; 148/DIG. 48; 148/DIG. 95; 148/DIG. 143; 148/DIG. 119; 156/613; 427/53.1; 437/133; 437/173; 437/936; 437/942; 437/963
[58] Field of Search ............. 148/DIG. 26, DIG. 48, 148/DIG. 65, DIG. 72, DIG. 95, DIG. 104, DIG. 106, DIG. 110, DIG. 169, DIG. 119; 118/721, 624; 156/610–614; 357/16, 17; 372/45, 46, 96; 427/53.1, 43.1, 54.1, 56.1; 437/16, 19, 107, 104, 126, 129, 133, 173, 942, 935, 936, 948, 963

[56] References Cited

U.S. PATENT DOCUMENTS

| | | | |
|---|---|---|---|
| 4,007,978 | 2/1977 | Holton | 372/50 |
| 4,280,107 | 7/1981 | Scifres et al. | 357/17 |
| 4,340,617 | 7/1982 | Deutsch et al. | 427/53.1 |
| 4,658,403 | 4/1987 | Takiguchi | 372/96 |
| 4,701,995 | 10/1987 | Dolan et al. | 437/129 |
| 4,704,720 | 11/1987 | Yamaguchi | 372/45 |
| 4,716,132 | 12/1987 | Hirata | 437/129 |
| 4,716,570 | 12/1987 | Yoshida et al. | 372/96 |
| 4,719,635 | 1/1988 | Yeh | 372/45 |
| 4,719,636 | 1/1988 | Yamaguchi | 372/96 |

FOREIGN PATENT DOCUMENTS 62-187709 1/1987 Japan .
8101529 6/1981 PCT Int'l Appl. .

OTHER PUBLICATIONS

Ehrlich et al., "Spatially Delineated Growth of Metal Films via Photochemical Prenucleation," Appl. Phys. Lett., 38(11), 1 Jun. 1981, pp. 946–948.
Allen et al., "Direct Writing Using Laser Chemical Vapor Deposition", Mat. Res. Soc. Symp. Proc., vol. 17 (1983), pp. 2–9.
"Reflectance and Luminescense of GaAs", J. Appl. Phys., vol. 43, No. 5, May 1972, pp. 2327–2335.

Primary Examiner—Brian E. Hearn
Assistant Examiner—William Bunch
Attorney, Agent, or Firm—Leydig, Voit & Mayer

[57] ABSTRACT

A method for producing a semiconductor laser comprising depositing a first semiconductor layer comprising n-type InP on an n-type InP substrate, depositing a diffraction grating of InGaAsP which includes or excludes doping impurities on the first semiconductor layer with irradiating interference fringes by a light excitation crystalline growth means, and burying a portion of the diffraction grating with InGaAsP including or excluding doping impurities with irradiating interference fringes reverse in light and darkness from said interference fringes used in depositing the diffraction grating.

1 Claim, 2 Drawing Sheets

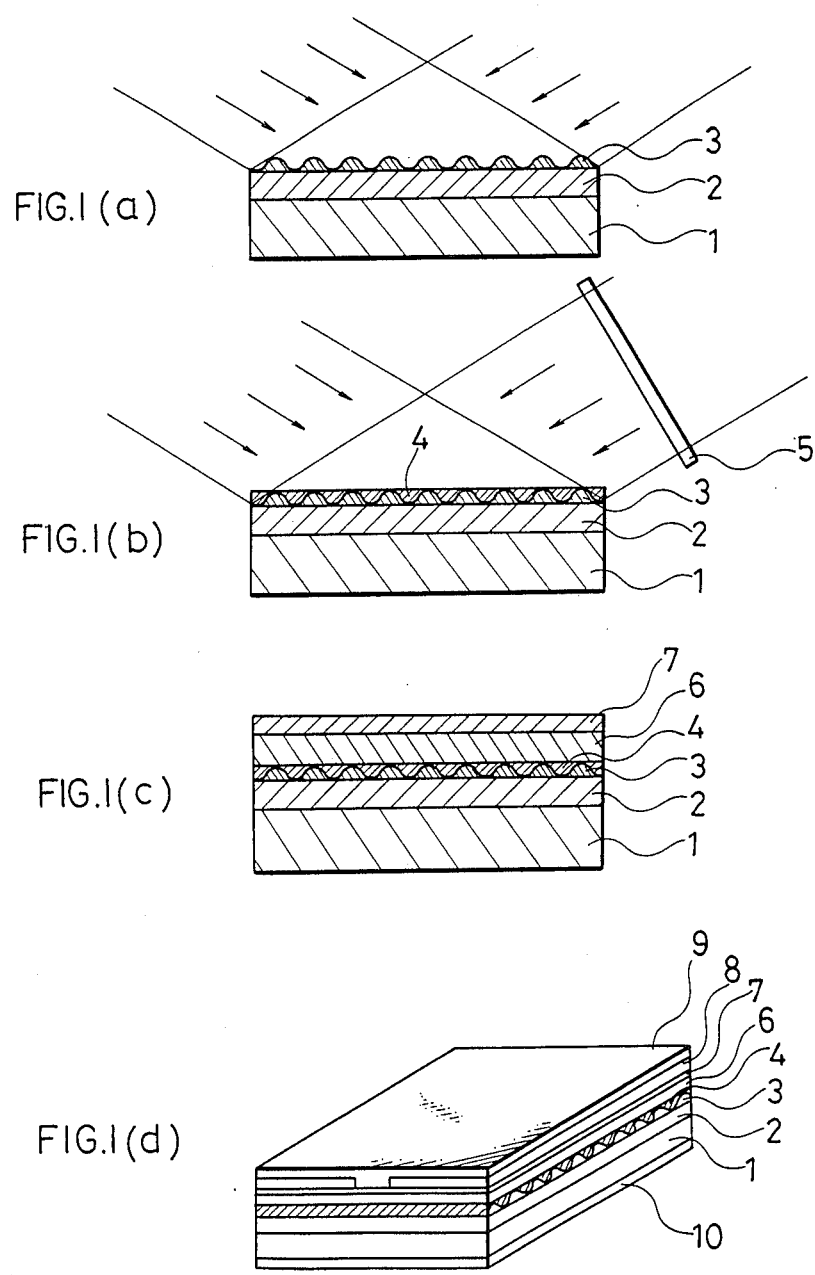

4,782,035

METHOD OF FORMING A WAVEGUIDE FOR A DFB LASER USING PHOTO-ASSISTED EPITAXY

FIELD OF THE INVENTION

The present invention relates to a distributed feedback type semiconductor laser and a method of producing same.

BACKGROUND ART

FIG. 2 shows a production process of a prior art distributed feedback type semiconductor laser device with the use of a conventional diffraction grating production method. In FIG. 1, the reference numeral 1 designates a substrate comprising n type InP, the numeral 11 designates a light guide layer comprising InGaAsP, the numeral 12 designates an active layer comprising InGaAsP having a longer wavelength than that of the light guide layer 1. The numeral 6 designates a cladding layer comprising p type InP. The numeral 7 designates a contact layer comprising p type InGaAsP. The numeral 8 designates an insulating film. The numeral 9 designates a P electrode and the 10 designates an N electrode.

The production process will be described.

At first, an InP substrate 1 is etched with a mask which is obtained by patterning a photo resist by an interference exposure method thereby to obtain a diffraction grating as shown in FIG. 2(a). Thereafter, a crystal growth is conducted on the substrate 1 on which a diffraction grating is produced by such as a general liquid phase epitaxy thereby to produce a light guide layer 11, an active layer 12, a cladding layer 6 and a contact layer 7 as shown in FIG. 2(b). Thereafter, an insulating film 8 is deposited on the contact layer 7, and a portion thereof is removed in a stripe configuration and a P electrode 9 and an N electrode 10 are produced to complete a distributed feedback type semiconductor laser shown in FIG. 2(c).

The device will be operated as follows.

In the semiconductor laser produced as above, a current is flown from the P type electrode 9 to the N type electrode 10. When the current exceeds a threshold value, a laser oscillation occurs due to the induced emission in the active layer and the feedback of the light of a wavelength determined by the diffraction grating.

In the distributed feedback type semiconductor laser of such a construction, according to "Coupled Wave Theory of Distributed Feedback Lasers" (J. Appl. Phy. Vol. 43, No. 5, May 1972, p. 2327), as a light coupling an Index Coupling in accordance with the periodicity of the refractive index occurs, and there arise two modes which give the lowest threshold gain, and a single wavelength oscillation is not likely to arise. Therefore, in order to make the laser oscillate at a single wavelength, a portion at which such as a λ/4 shift occurs in the phase of the diffraction grating is required to be provided in the way of the diffraction grating, and this makes the production process difficult and lengthened. Furthermore, in the prior art method of producing a distributed feedback type semiconductor laser, the surface of the diffraction grating is made an exposed surface because the crystal growth is conducted after the production of the diffraction grating. The active layer is produced close to this surface, and a light absorption occurs caused by such as crystal defects at the exposed surface, thereby lowering the light output efficiency and quickening the deterioration, which leads to a short life.

SUMMARY OF THE INVENTION

An object of the present invention is to provide a semiconductor laser which is likely to oscillate at a Bragg wavelength.

Another object of the present invention is to provide a method of producing a semiconductor laser in which the diffraction grating surface of the laser is not made an exposed surface, and by which a laser having a high light output efficiency and a long life is obtained.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, there is provided a semiconductor laser of a distributed feedback type, which comprises: an active layer having a diffraction grating type gain periodicity in the resonator length direction.

According to another aspect of the present invention, there is provided a method of producing a semiconductor laser comprising: a process of producing a first semiconductor layer comprising n type InP on an n type InP substrate; a process of producing a diffraction grating of InGaAsP into which impurities are doped or undoped on the first semiconductor layer with irradiating interference fringes by a light exitation crystalline growth method; and a process of burying a portion of the diffraction grating by InGaAsP into which impurities are undoped or doped with irradiating interference fringes reverse to the interference fringes in light and darkness.

BRIEF DESCRIPTION OF THE DRAWINGS

FIG. 1 is a cross-sectional view showing a method of producing a distributed feedback type semiconductor laser as an embodiment of the present invention.

DETAILED DESCRIPTION OF THE PREFERRED EMBODIMENTS

Figure 2A:
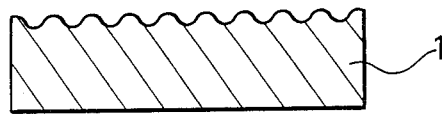
FIG. 2 is a cross-sectional view showing a method of producing a prior art distributed feedback type semiconductor laser.
Figure 2B:
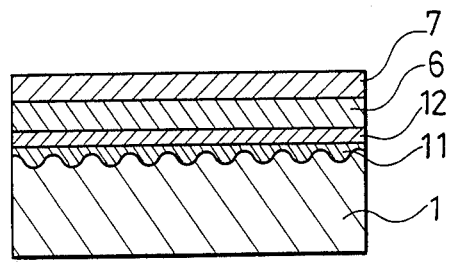
Figure 2C:
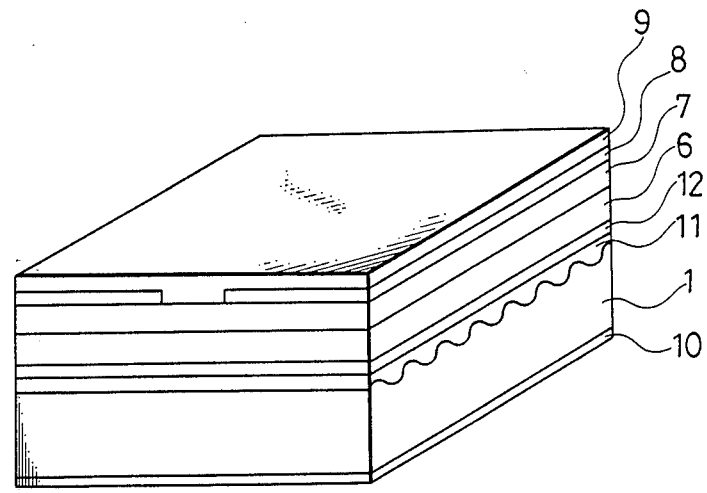

In order to explain the present invention in detail, the reference will be particularly made to FIG. 1.

FIG. 1 shows a method of producing a distributed feedback type semiconductor layer as an embodiment of the present invention. In FIG. 1, the reference numeral 1 designates an n type InP substrate, the numeral 2 designates a first semiconductor layer comprising n type InP, the numeral 3 designates an active layer having periodicity of about 2000 Å in its thickness comprising InGaAsP to which Fe is not doped. The numeral 4 designates an current blocking layer having periodicity in its thickness comprising InGaAsP to which Fe is doped. The numeral 5 designates a phase shift plate for inverting the phase of the interference fringes. The numeral 6 designates a cladding layer comprising p type InP. The numeral 7 designates a contact layer comprising p type InGaAsP, and the numeral 8 designates an insulating layer. The numeral 9 designates a P electrode and the numeral 10 designates an N electrode.

The production method will be described as follows.

At first, a first semiconductor layer 2 is grown on the InP substrate 1. Next, an InGaAsP diffraction grating 3 to which Fe is not doped is produced on the first semiconductor layer 2 by a light excitation crystal growth method with irradiating interference fringes thereto (refer to FIG. 1(a)). Subsequently, as shown in FIG. 1(b), the phase of the interference fringes is reversed by such as a phase shift plate 5, and an InGaAsP layer to which Fe is doped is produced by a light excitation crystal growth method so as to embed the diffraction grating. Furthermore, a p type InP cladding layer 6 and a p type InGaAsP contact layer 7 are produced on the InGaAsP layer 4 by such as a vapor phase epitaxy as shown in FIG. 1(c). Thereafter, an insulating film 8 is deposited on the contact layer 7 and a portion thereof is removed in a stripe configuration. Thereafter, a P electrode 9 and an N electrode 10 are produced to complete a laser shown in FIG. 1(d).

The device is operated as follows.

The semiconductor laser of this embodiment produced as described above has portions having a gain (the InGaAsP region 3 which is not Fe doped and functions as an active layer) and portions having no gain (the InGaAsP region 4 which is Fe doped and functions as a blocking layer) both periodically produced in the light advancing direction in the active layer. Furthermore, there is no difference in the refractive index in the active layer. Accordingly, this embodiment is more likely to oscillate at a single wavelength than the prior art device.

The effects by the production method of the present invention will be described as follows.

In the production method of the present invention the diffraction grating is not made an exposed surface because the processes of producing the undoped InGaAsP region 3 and the Fe doped InGaAsP region 4 are conducted successively. Accordingly, there is no deterioration and loss due to the exposed surface, whereby a high light output efficiency, and long life semiconductor laser is obtained.

In the above-described embodiment an n type semiconductor substrate is used, but a p type semiconductor substrate can be used with inverting the conductivity types of the other crystalline layers.

Furthermore, the order of the productions of the not Fe doped InGaAsP layer and Fe doped InGaAsP layer can be reversed.

Furthermore, an insulating film stripe laser is described, but the present invention can be also applied to a buried type semiconductor laser.

As is evident from the foregoing description, according to the present invention an active layer is constituted in a structure having a periodicity of gain in the light advancing direction, thereby enabling a single wavelength oscillation at a wavelength determined by the diffraction grating.

Furthermore, in the method of producing a semiconductor laser according to the present invention, the neighbourhood of the active layer including a diffraction grating is successively grown by a light excitation crystal growth method, whereby an exposed surface is not produced and a semiconductor laser having a high light output efficiency and a long life is obtained.

What is claimed is:

1. A method of producing a semiconductor laser comprising:
   a process of producing a first semiconductor layer comprising n type InP on an n type InP substrate;
   a process of producing a diffraction grating of InGaAsP into which impurities are doped or undoped on said first semiconductor layer with irradiating interference fringes by a light exitation crystalline growth method; and
   a process of burying a portion of said diffraction grating by InGaAsP into which impurities are undoped or doped with irradiating interference fringes reverse to said interference fringes in light and darkness.

* * * * *